United States Patent
Priewasser

(10) Patent No.: US 9,472,442 B2
(45) Date of Patent: Oct. 18, 2016

(54) WAFER PROCESSING METHOD

(71) Applicant: DISCO CORPORATION, Tokyo (JP)

(72) Inventor: Karl Heinz Priewasser, Munich (DE)

(73) Assignee: Disco Corporation, Tokyo (JP)

(*) Notice: Subject to any disclaimer, the term of this patent is extended or adjusted under 35 U.S.C. 154(b) by 0 days.

(21) Appl. No.: 14/707,636

(22) Filed: May 8, 2015

(65) Prior Publication Data
US 2015/0332928 A1 Nov. 19, 2015

(30) Foreign Application Priority Data
May 13, 2014 (JP) .................. 2014-099269

(51) Int. Cl.
*H01L 21/304* (2006.01)
*H01L 21/683* (2006.01)
*H01L 21/02* (2006.01)
*H01L 21/78* (2006.01)
*H01L 21/687* (2006.01)
(Continued)

(52) U.S. Cl.
CPC ... *H01L 21/68728* (2013.01); *H01L 21/02076* (2013.01); *H01L 21/304* (2013.01); *H01L 21/6715* (2013.01); *H01L 21/67046* (2013.01); *H01L 21/6836* (2013.01); *H01L 21/78* (2013.01); *H01L 23/544* (2013.01); *H01L 2221/6834* (2013.01); *H01L 2221/68327* (2013.01); *H01L 2223/54493* (2013.01); *H01L 2924/0002* (2013.01)

(58) Field of Classification Search
CPC .......... H01L 21/6835; H01L 21/6836; H01L 21/02076; H01L 21/67046; H01L 21/6715; H01L 21/304; H01L 23/544; H01L 21/68728; H01L 21/78; H01L 2221/68327; H01L 2223/54493; H01L 2221/6834
See application file for complete search history.

(56) References Cited

U.S. PATENT DOCUMENTS 7,687,375 B2 * 3/2010 Arai ..................... B23K 26/032
438/460
8,486,806 B2 * 7/2013 Hirosawa ............. H01L 21/304
438/463
(Continued)

FOREIGN PATENT DOCUMENTS

| JP | 2007-19379 | 1/2007 | |
|---|---|---|---|
| JP | 2007-19461 | 1/2007 | |
| JP | 102011078726 A1 * | 1/2012 | ....... H01L 21/67092 |

OTHER PUBLICATIONS

DE 102011078726 A1 English translation.*

*Primary Examiner* — Latanya N Crawford
(74) *Attorney, Agent, or Firm* — Greer Burns & Crain Ltd.

(57) ABSTRACT

A wafer processing method which includes a first tape attaching step of attaching a first tape to the front side of a wafer and mounting the wafer through the first tape to a first annular frame, a separating step of holding the wafer through the first tape on a chuck table and applying a laser beam to the boundary between an annular projection formed along the outer circumference of the wafer and a device area surrounded by the annular projection to cut the wafer and the first tape along this boundary, thereby separating the device area from the annular projection, and a removing step of removing the annular projection together with the first annular frame from the device area of the wafer in the condition where the annular projection is supported through the first tape to the first annular frame.

3 Claims, 14 Drawing Sheets

(51) Int. Cl.
*H01L 21/67* (2006.01)
*H01L 23/544* (2006.01)

(56) References Cited

U.S. PATENT DOCUMENTS

| | | | | |
|---|---|---|---|---|
| 2005/0205531 A1* | 9/2005 | Iizuka | ............... | B23K 26/0648 219/121.18 |
| 2005/0250295 A1* | 11/2005 | Mita | .................. | H01L 21/6835 438/460 |
| 2008/0280421 A1* | 11/2008 | Nakamura | ......... | B23K 26/0057 438/462 |
| 2009/0181519 A1* | 7/2009 | Arai | ..................... | B23K 26/032 438/458 |
| 2010/0055877 A1* | 3/2010 | Kajiyama | ........... | H01L 21/6835 438/464 |
| 2011/0287609 A1* | 11/2011 | Kobayashi | ............ | H01L 21/304 438/464 |
| 2012/0322231 A1* | 12/2012 | Kim | ...................... | H01L 21/561 438/460 |
| 2014/0179084 A1* | 6/2014 | Lei | ......................... | H01L 21/78 438/463 |
| 2015/0251902 A1* | 9/2015 | Bernales | ............... | H01L 21/304 438/50 |

* cited by examiner

WAFER PROCESSING METHOD

BACKGROUND OF THE INVENTION

1. Field of the Invention

The present invention relates to a processing method for a wafer having a circular recess on the back side of the wafer and an annular projection surrounding the circular recess, wherein the annular projection is removed from the wafer by this method.

2. Description of the Related Art

In a semiconductor device fabrication process, a plurality of crossing division lines called streets are formed on the front side of a substantially disk-shaped semiconductor wafer (which will be hereinafter referred to also simply as a wafer) to thereby define a plurality of separate regions where a plurality of devices such as ICs and LSIs are formed. The semiconductor wafer is cut along the streets by using a cutting apparatus, thereby dividing the wafer into a plurality of individual semiconductor chips (devices).

Prior to cutting the wafer along the streets, the back side of the wafer is ground to reduce the thickness of the wafer to a predetermined thickness. In recent years, it has been required to reduce the thickness of the wafer to a smaller value, e.g., about 50 µm, in order to achieve the miniaturization (reduction in size and weight) of electrical equipment. Such a thin wafer lacks stiffness like a sheet of paper and it is difficult to handle, so that there is a possibility of damage to the wafer during transfer. To cope with this problem, there has been proposed a grinding method in Japanese Patent Laid-open No. 2007-19461, for example, wherein the back side of a wafer having a device area and a peripheral marginal area surrounding the device area on the front side is ground to form a circular recess in only a central portion corresponding to the device area, so that a reinforcing annular projection is formed around the circular recess on the back side of the wafer so as to correspond to the peripheral marginal area.

As a method of dividing such a wafer along the streets (division lines), the wafer having an annular projection on the back side along the outer circumference of the wafer, there has been proposed a method including the steps of removing the annular projection and next cutting the wafer along the streets from the front side thereof by using a cutting blade (see Japanese Patent Laid-open No. 2007-19379). In Japanese Patent Laid-open No. 2007-19379, the step of removing the annular projection is disclosed as a method of grinding the annular projection to remove the same or a method including the steps of circularly cutting the boundary between the circular recess corresponding to the device area and the annular projection and next removing the annular projection from the device area.

SUMMARY OF THE INVENTION

However, there are various problems in removing the annular projection from the device area. For example, the annular projection is susceptible to damage, the device area may be marred due to the damage to the annular projection, and any special apparatus for removing the annular projection is required. Thus, it is difficult to remove the annular projection without problems.

It is therefore an object of the present invention to provide a wafer processing method which can easily remove the annular projection without causing damage thereto.

In accordance with an aspect of the present invention, there is provided a processing method for a wafer having a device area where a plurality of devices are formed and a peripheral marginal area surrounding the device area on the front side of the wafer, wherein a circular recess corresponding to the device area is formed on the back side of the wafer by grinding the wafer to a predetermined thickness, and an annular projection corresponding to the peripheral marginal area is resultantly formed around the circular recess, the processing method including a first tape attaching step of attaching a first tape to the front side of the wafer and mounting the wafer through the first tape to a first annular frame; a separating step of holding the wafer through the first tape on a chuck table after performing the first tape attaching step and then applying a laser beam to the boundary between the annular projection and the device area to cut the wafer and the first tape along the boundary, thereby separating the device area from the annular projection; and a removing step of removing the annular projection together with the first annular frame from the device area of the wafer in the condition where the annular projection is supported through the first tape to the first annular frame after performing the separating step.

Preferably, the processing method further includes a second tape attaching step of attaching a second tape to the back side of the wafer composed of only the device area after performing the removing step and mounting the wafer through the second tape to a second annular frame; a first tape removing step of removing the first tape from the front side of the wafer before or after performing the second tape attaching step; and a dividing step of dividing the wafer into a plurality of chips corresponding to the plurality of devices after performing the second tape attaching step and the first tape removing step.

Preferably, the processing method further includes a protective film forming step of forming a water-soluble protective film on the back side of the wafer before performing the separating step; and a protective film removing step of supplying a cleaning water to the back side of the wafer after performing the protective film forming step and the separating step to remove the protective film.

According to the processing method of the present invention, the separating step by the application of a laser beam is performed. Thereafter, the annular projection attached to the first tape is removed together with the first annular frame from the device area of the wafer. Accordingly, the annular projection can be easily removed from the device area without suffering damage. Since the separating step is performed by applying a laser beam, there is no possibility of corrosion in the case that a metal film is formed on the bottom surface of the circular recess formed on the back side of the wafer. Further, since the separating step is performed by using a laser beam, the width of a kerf to be formed by the laser beam can be made smaller than that of a kerf to be formed by a cutting blade, so that an effective device area can be maximized.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
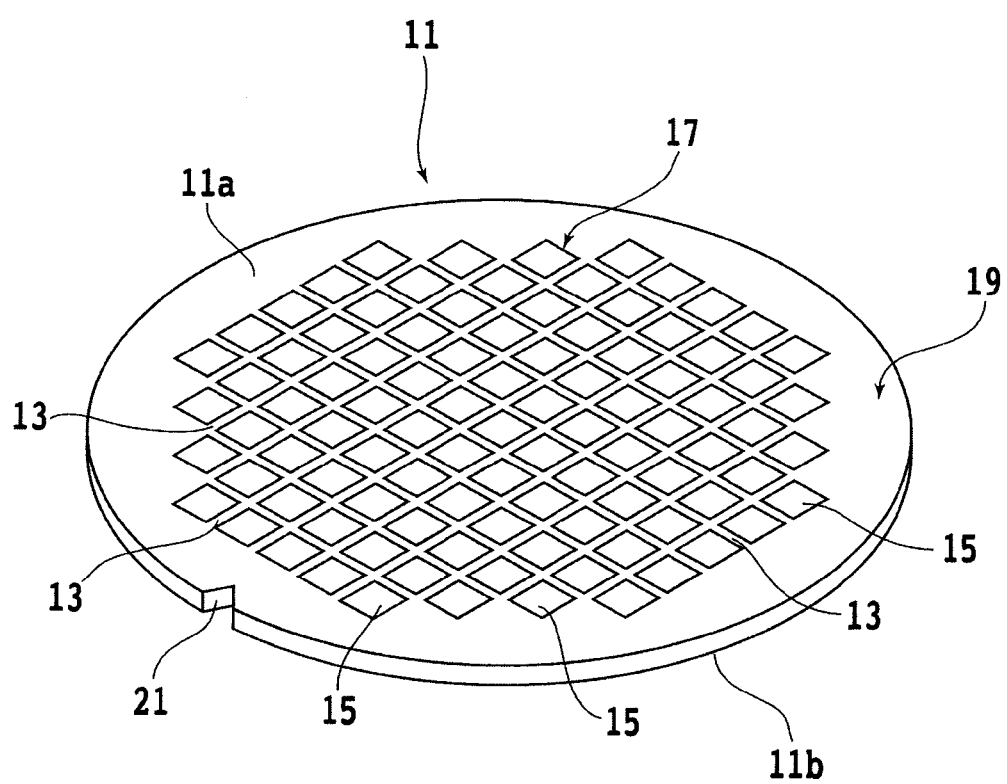
FIG. 1 is a perspective view of a semiconductor wafer as viewed from the front side thereof.

A preferred embodiment of the present invention will now be described in detail with reference to the drawings. Referring to FIG. 1, there is shown a perspective view of a semiconductor wafer (which will be hereinafter referred to also simply as a wafer) 11 as viewed from the front side 11a thereof. The semiconductor wafer 11 is formed from a silicon wafer having a thickness of 700 µm, for example. A plurality of crossing streets (division lines) 13 are formed on the front side 11a of the semiconductor wafer 11 to thereby define a plurality of rectangular separate regions where a plurality of devices 15 such as ICs and LSIs are formed. The front side 11a of the semiconductor wafer 11 is generally composed of a device area 17 where the devices 15 are formed and a peripheral marginal area 19 surrounding the device area 17. Further, the outer circumference of the semiconductor wafer 11 is formed with a notch 21 as a mark for indicating the crystal orientation of the silicon wafer.

Figure 2:
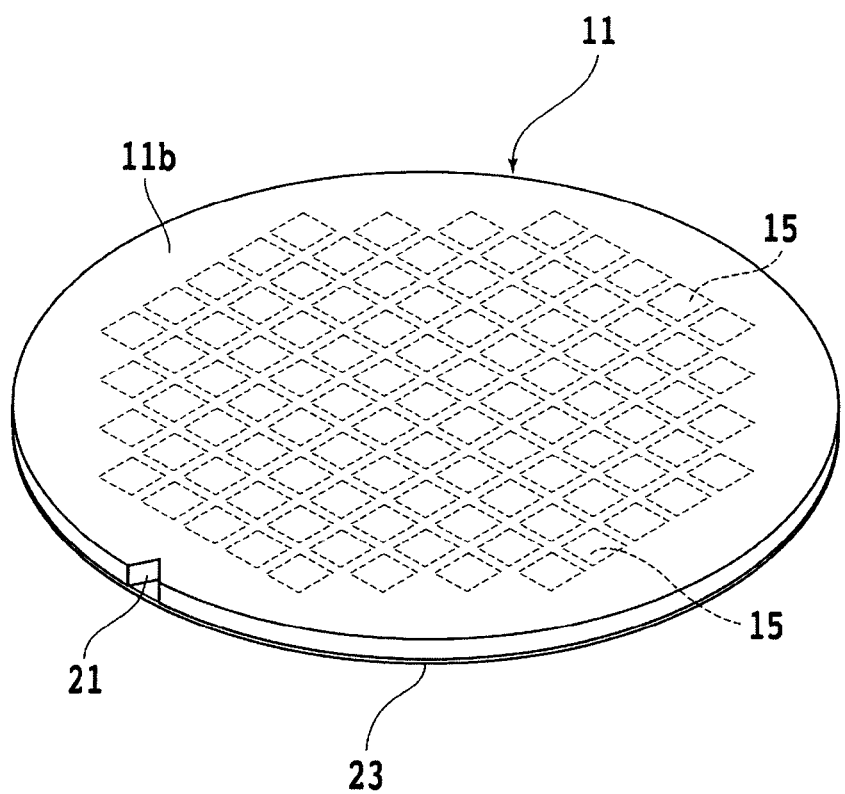
FIG. 2 is a perspective view of the wafer as viewed from the back side thereof in the condition where a protective tape is attached to the front side of the wafer.

Prior to grinding the back side 11b of the wafer 11, a protective tape 23 is attached to the front side 11a of the wafer 11 as shown in FIG. 2. Accordingly, the front side 11a of the wafer 11 is protected by the protective tape 23 and the back side 11b of the wafer 11 is exposed as shown in FIG. 2. The wafer 11 as a workpiece to be processed by the processing method of the present invention is a wafer having a circular recess and an annular projection surrounding the circular recess on the back side of the wafer, wherein the circular recess is formed by grinding the back side 11b of the wafer 11 in an area corresponding to the device area 17 to reduce the thickness of the wafer 11 in this area to a predetermined thickness, so that the annular projection corresponding to the peripheral marginal area 19 is formed around the circular recess. A wafer grinding method (back grinding step) of grinding the back side 11b of the wafer 11 will now be described with reference to FIGS. 3 and 4.

Figure 3:
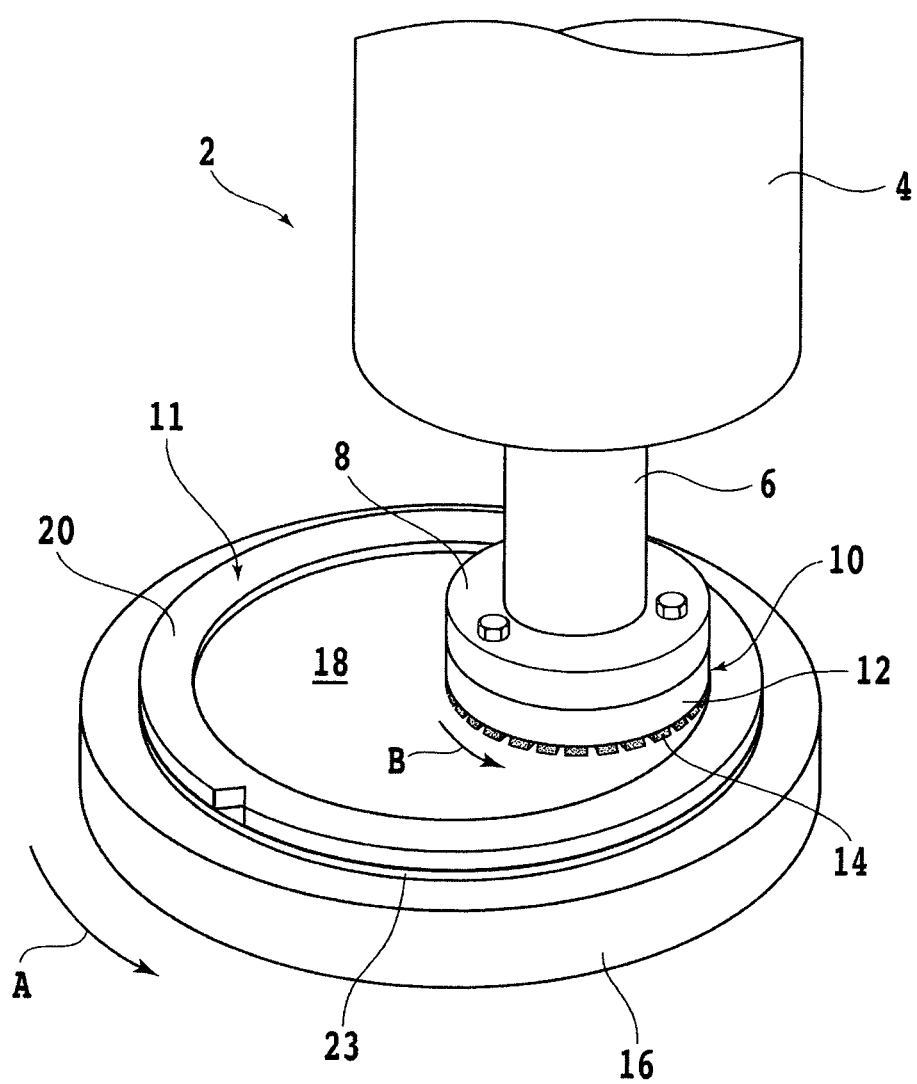
FIG. 3 is a perspective view showing a back grinding step.

The back grinding step is performed by using a grinding apparatus having a grinding unit 2 shown in FIG. 3. As shown in FIG. 3, the grinding unit 2 includes a spindle housing 4, a spindle 6 rotatably supported in the spindle housing 4, a wheel mount 8 fixed to the lower end of the spindle 6, and a grinding wheel 10 detachably mounted on the lower surface of the wheel mount 8. The grinding wheel 10 is composed of an annular wheel base 12 and a plurality of abrasive members 14 fixed to the lower surface of the annular wheel base 12 so as to be arranged annularly along the outer circumference of the wheel base 12.

Figure 4:
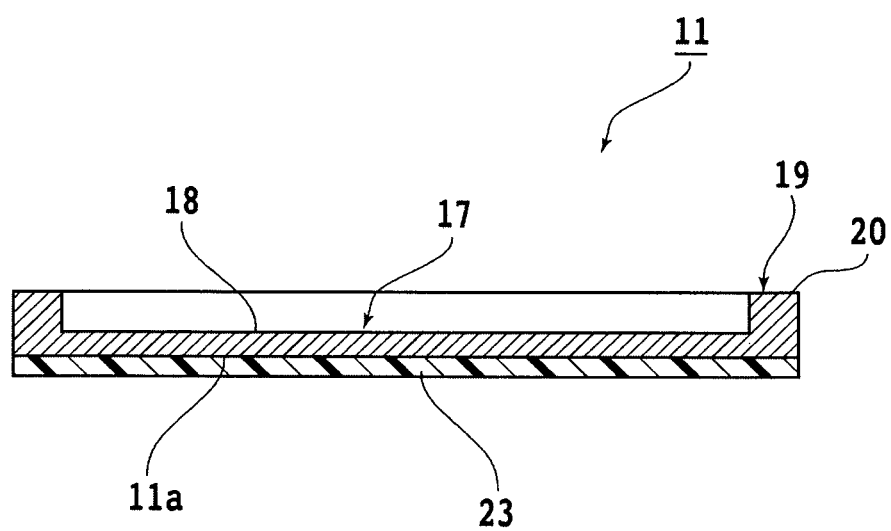
FIG. 4 is a sectional view of the wafer processed by the back grinding step.

In performing the back grinding step, the wafer 11 shown in FIG. 2 is held under suction on a chuck table 16 included in the grinding apparatus in the condition where the protective tape 23 attached to the front side 11a of the wafer 11 is in contact with the upper surface of the chuck table 16, so that the back side 11b of the wafer 11 is exposed. In this condition, the chuck table 16 is rotated at 300 rpm, for example, in the direction shown by an arrow A in FIG. 3, and the grinding wheel 10 is also rotated at 6000 rpm, for example, in the direction shown by an arrow B in FIG. 3. Further, a grinding unit feeding mechanism (not shown) included in the grinding apparatus is operated to lower the grinding unit 2 until the abrasive members 14 of the grinding wheel 10 come into contact with the back side 11b of the wafer 11. Thereafter, the grinding unit feeding mechanism is further operated to downwardly feed the grinding wheel 10 by a predetermined amount at a predetermined feed speed. As a result, the back side 11b of the wafer 11 is ground in its central area corresponding to the device area 17, thereby forming a circular recess 18 as shown in FIGS. 3 and 4. At the same time, the peripheral area of the back side 11b around the circular recess 18 is left as an annular projection 20 corresponding to the peripheral marginal area 19 as shown in FIGS. 3 and 4.

Figure 5:
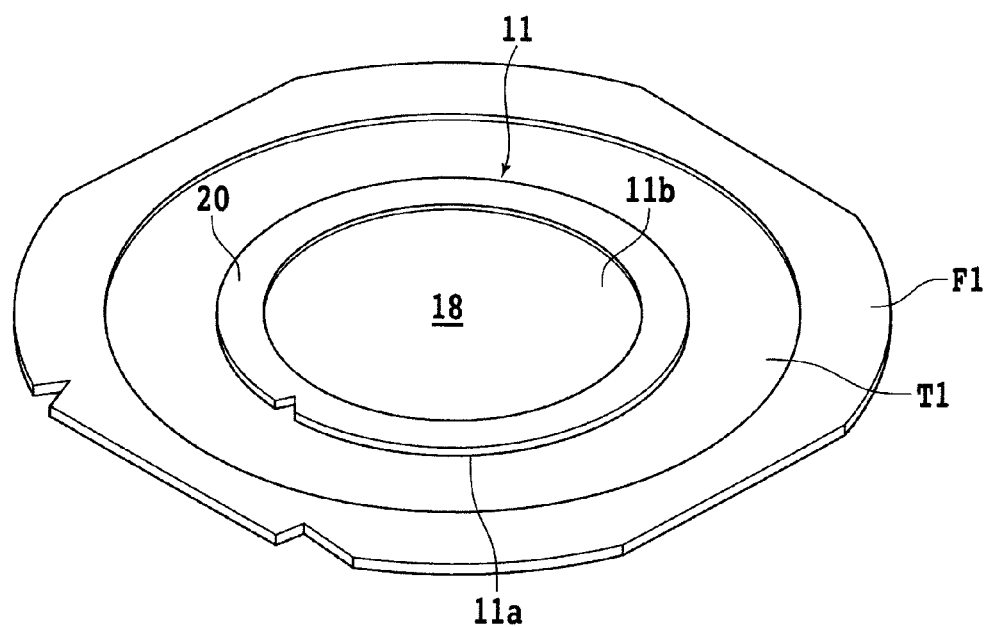
FIG. 5 is a perspective view showing a first tape attaching step.

After performing the back grinding step to grind the back side 11b of the wafer 11 as mentioned above, a first tape attaching step is performed in the following manner as shown in FIG. 5. First, the protective tape 23 attached to the front side 11a of the wafer 11 is peeled off. Thereafter, a first dicing tape T1 as an adhesive tape is attached to the front side 11a of the wafer 11, and the wafer 11 is then mounted through the first dicing tape T1 to a first annular frame F1 as shown in FIG. 5. In other words, the front side 11a of the wafer 11 is attached to the first dicing tape T1 whose peripheral portion is attached to the first annular frame F1. As a modification, the protective tape 23 attached to the front side 11a of the wafer 11 may not be peeled off, but the first dicing tape T1 may be attached through the protective tape 23 to the front side 11a of the wafer 11.

Figure 6:
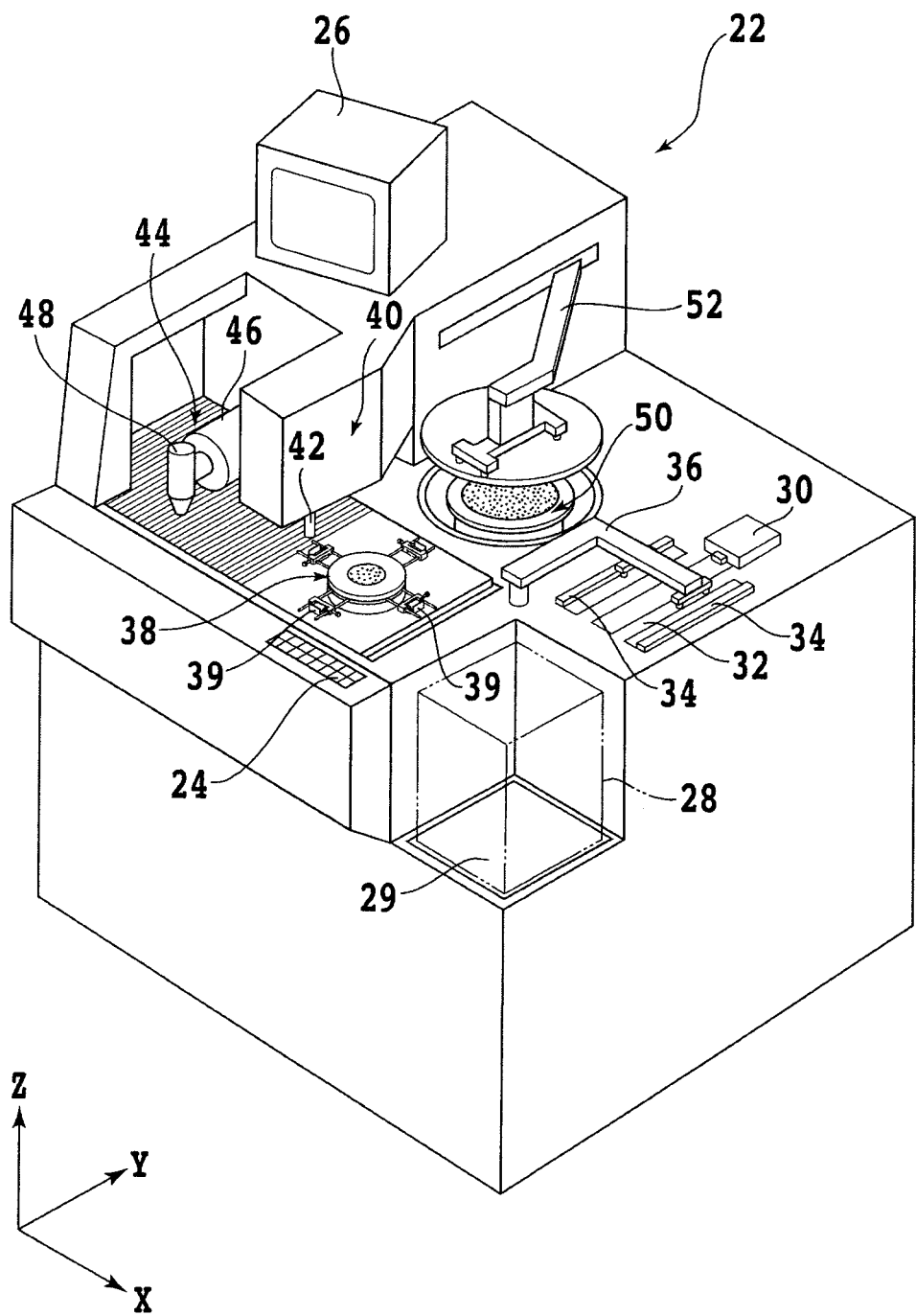
FIG. 6 is a perspective view of a laser processing apparatus.

Referring to FIG. 6, there is shown a perspective view of a laser processing apparatus 22 for use in dividing the device area 17 and the annular projection 20 from each other. As shown in FIG. 6, the laser processing apparatus 22 includes an operation panel 24 for allowing an operator to input instructions such as processing conditions to the laser processing apparatus 22. The operation panel 24 is provided at the front portion of the laser processing apparatus 22. The laser processing apparatus 22 further includes a display unit 26 such as a CRT for displaying a guide view to the operator or an image obtained by an imaging unit to be hereinafter described. The display unit 26 is provided at the upper portion of the laser processing apparatus 22. As shown in FIG. 5, the wafer 11 processed by the back grinding step is supported through the first dicing tape T1 to the first annular frame F1. A plurality of (e.g., 25) such wafers 11 each supported through the first dicing tape T1 to the first annular frame F1 are stored in a wafer cassette 28 shown in FIG. 6. The wafer cassette 28 is placed on a vertically movable cassette elevator 29.

Wafer handling means 30 is provided on the rear side of the wafer cassette 28 to take a desired one of the plural wafers 11 out of the wafer cassette 28 before laser processing and also bring back the wafer 11 into the wafer cassette

28 after laser processing. A temporary placing area 32 for temporarily placing the wafer 11 to be handled by the wafer handling means 30 is provided between the wafer cassette 28 and the wafer handling means 30. Positioning means (a pair of centering guides) 34 for positioning the wafer 11 is provided in the temporary placing area 32.

Reference numeral 50 denotes a protective film forming unit for forming a protective film on the back side 11b of the wafer 11 before laser processing. The protective film forming unit 50 serves also as a cleaning unit for cleaning the wafer 11 after laser processing. First transfer means 36 having a pivotable arm for transferring the wafer 11 by holding the first annular frame F1 supporting the wafer 11 under suction is provided near the temporary placing area 32. The wafer 11 taken out of the wafer cassette 28 and positioned in the temporary placing area 32 is transferred to the protective film forming unit 50 by the first transfer means 36. As described later, the protective film forming unit 50 functions to apply a water-soluble resin to the back side 11b of the wafer 11, thereby forming a protective film on the back side 11b of the wafer 11.

After forming the protective film on the back side 11b of the wafer 11, the wafer 11 is transferred to a chuck table 38 by the first transfer means 36. The wafer 11 transferred to the chuck table 38 is held on the chuck table 38 under suction. Further, the first annular frame F1 supporting the wafer 11 through the first dicing tape T1 is fixed by a plurality of clamps 39 as fixing means. The chuck table 38 is rotatable and movable in the X direction shown in FIG. 6. An alignment unit 40 for detecting a subject area of the wafer 11 to be laser-processed is provided above the path of movement of the chuck table 38 in the X direction.

The alignment unit 40 includes an imaging unit 42 for imaging the wafer 11. According to an image obtained by the imaging unit 42, the alignment unit 40 can detect the subject area of the wafer 11 by performing image processing such as pattern matching. The image obtained by the imaging unit 42 is displayed by the display unit 26. A laser beam applying unit 44 for applying a laser beam to the wafer 11 held on the chuck table 38 is provided on the left side of the alignment unit 40 as viewed in FIG. 6. The laser beam applying unit 44 is movable in the Y direction shown in FIG. 6.

The laser beam applying unit 44 includes a casing 46 and a laser beam generating unit (not shown) provided in the casing 46 for generating a laser beam. The laser beam generating unit has a laser oscillator such as a YAG laser oscillator. The laser beam applying unit 44 further includes focusing means 48 mounted on the front end of the casing 46 for focusing the laser beam generated from the laser beam generating unit. The laser beam focused by the focusing means 48 is applied to the wafer 11 held on the chuck table 38, thereby performing laser processing to the wafer 11. After performing the laser processing, the wafer 11 is transferred from the chuck table 38 to the protective film forming unit 50 by second transfer means 52. In the protective film forming unit 50 serving also as a cleaning unit, the wafer 11 is cleaned.

Figure 7:
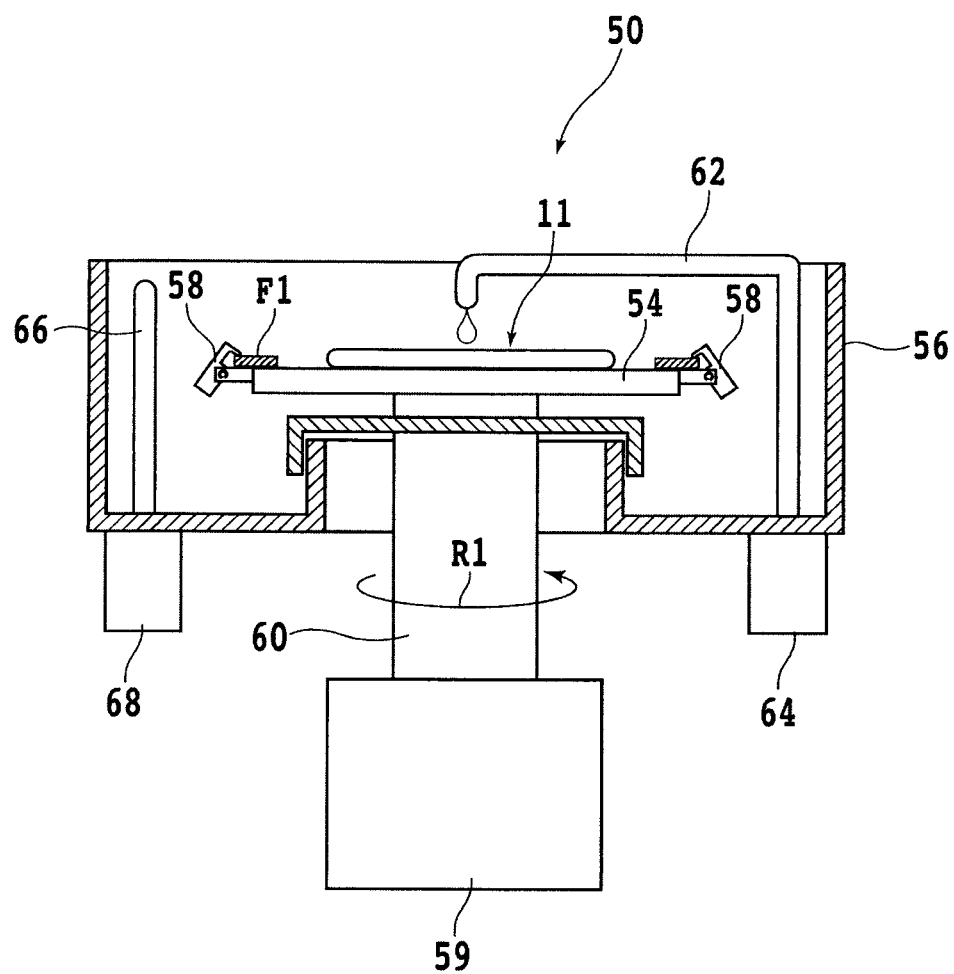
FIG. 7 is a sectional view showing a protective film forming step.

A protective film forming step of forming a protective film on the back side 11b of the wafer 11 by using the protective film forming unit 50 will now be described with reference to FIG. 7. This protective film forming step is an optional step and this step is usually unnecessary. However, in the case that a metal film is formed on the back side 11b of the wafer 11, that is, on the bottom surface of the circular recess 18, the protective film forming step is performed. As shown in FIG. 7, the protective film forming unit 50 includes a spinner table 54 and a cleaning water receptacle 56 provided so as to surround the spinner table 54. The spinner table 54 is composed of a suction holding member formed of a porous material such as porous ceramics and a mount member provided around the suction holding member for mounting the same. The spinner table 54 is provided with a plurality of pendulum type clamps 58 for clamping the first annular frame F1 supporting the wafer 11 through the first dicing tape T1. The spinner table 54 is connected to an output shaft 60 of an electric motor 59.

The protective film forming unit 50 further includes a water-soluble resin nozzle 62 for supplying a water-soluble resin to the semiconductor wafer 11 held on the spinner table 54 before laser processing and a cleaning water nozzle 66 for supplying a cleaning water to the wafer 11 after laser processing. The water-soluble resin nozzle 62 is adapted to be rotated (horizontally swung) between a standby position and a supply position by operating a motor 64. Similarly, the cleaning water nozzle 66 is adapted to be rotated (horizontally swung) between a standby position and a supply position by operating a motor 68.

In performing the protective film forming step, the wafer 11 processed by the first tape attaching step shown in FIG. 5 is first transferred from the temporary placing area 32 to the protective film forming unit 50 by operating the first transfer means 36. Then, the wafer 11 is placed on the spinner table 54 of the protective film forming unit 50. Thereafter, the motor 64 is operated to rotate the water-soluble resin nozzle 62 from the standby position to the supply position shown in FIG. 7. At this supply position, the water-soluble resin is supplied from the water-soluble resin nozzle 62 to the wafer 11 at its central portion. Thereafter, the electric motor 59 is operated to rotate the spinner table 54 at about 2000 rpm in the direction shown by an arrow R1 in FIG. 7. Accordingly, the water-soluble resin supplied to the wafer 11 is spin-coated over the entire bottom surface of the circular recess 18 formed on the back side 11b of the wafer 11.

The spinner table 54 is rotated at about 2000 rpm, i.e., at a relatively high speed, so that the pendulum type clamps 58 are vertically swung by a centrifugal force due to the rotation of the spinner table 54 to thereby clamp the first annular frame F1 supporting the wafer 11 held on the spinner table 54. Accordingly, the water-soluble resin supplied to the circular recess 18 of the wafer 11 is spin-coated over the entire bottom surface of the circular recess 18, thereby forming a water-soluble protective film on the bottom surface of the circular recess 18. Examples of the water-soluble resin forming the water-soluble protective film include PVA (Poly Vinyl Alcohol), PEG (Poly Ethylene Glycol), and PEO (Poly Ethylene Oxide).

Figure 8:
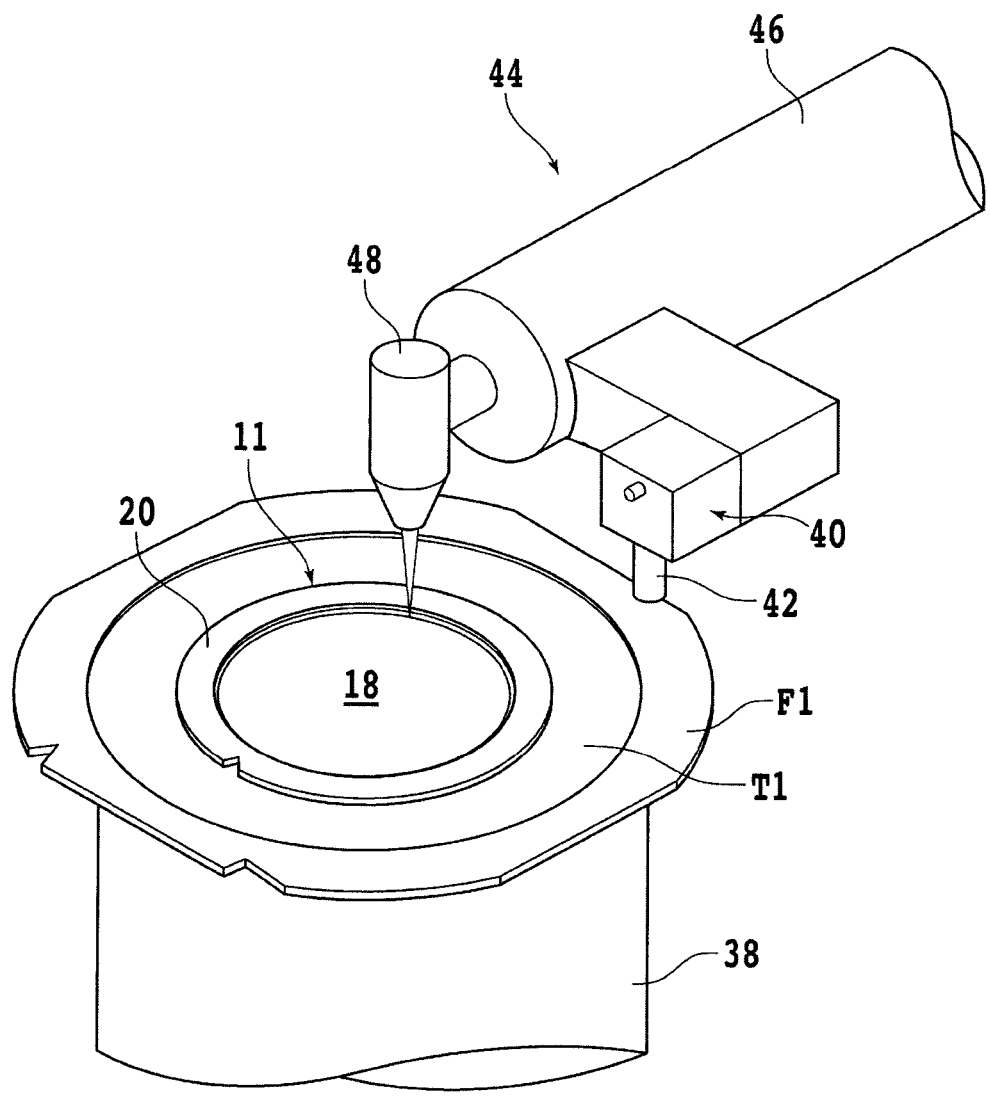
FIG. 8 is a perspective view showing a separating step.

After performing the first tape attaching step or after performing the first tape attaching step and the next protective film forming step, a separating step is performed in such a manner that the device area 17 and the annular projection 20 of the wafer 11 are separated from each other by using the laser processing apparatus 22 shown in FIG. 6. The separating step will now be described with reference to FIG. 8. As shown in FIG. 8, the wafer 11 supported through the first dicing tape T1 to the first annular frame F1 is held under suction on the chuck table 38 of the laser processing apparatus 22 in the condition where the first dicing tape T1 attached to the front side 11a of the wafer 11 is in contact with the upper surface of the chuck table 38, i.e., the back side 11b of the wafer 11 is exposed. Thereafter, alignment is performed in such a manner that the wafer 11 is imaged by the imaging unit 42 to detect the boundary between the annular projection 20 and the device area 17 (the circular recess 18) and that the coordinate values for the boundary detected above are next stored into a memory included in the alignment unit 40.

Figure 9:
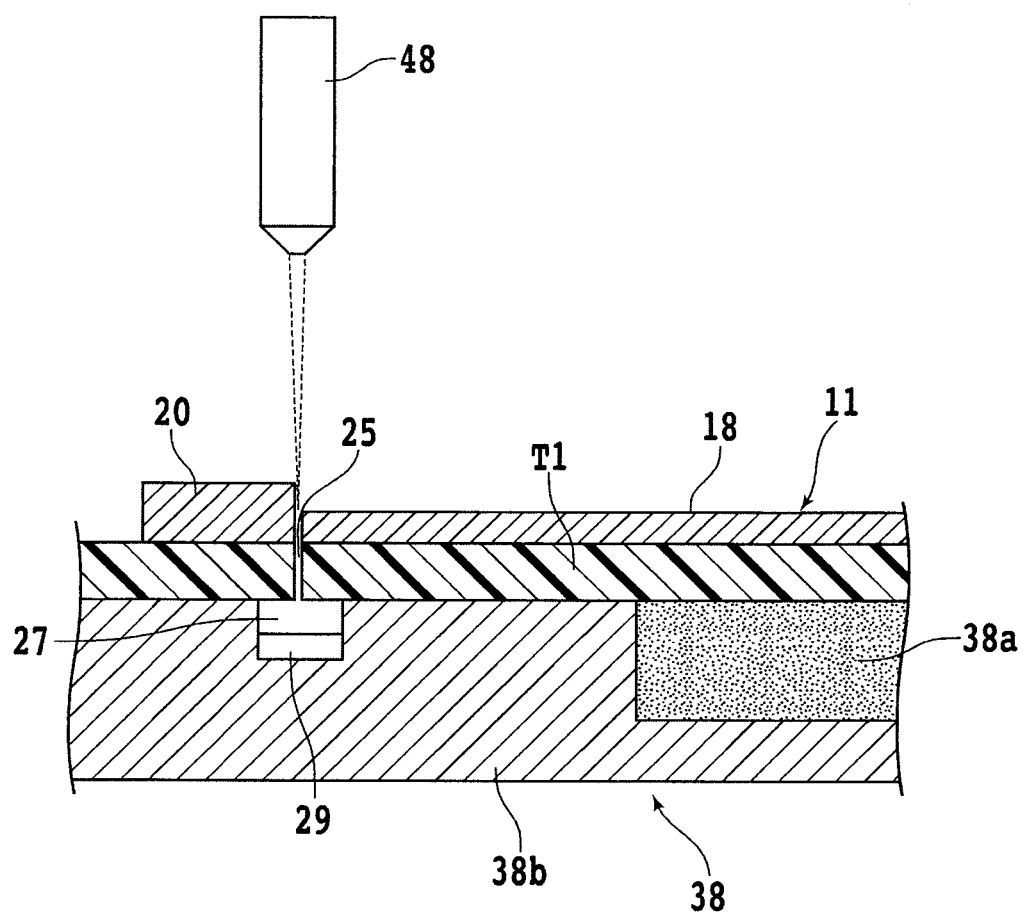
FIG. 9 is an enlarged sectional view showing the separating step.

After performing the alignment as mentioned above, a laser beam having an absorption wavelength (e.g., 355 mm) to the wafer 11 is applied from the focusing means 48 of the laser beam applying unit 44 to the boundary between the annular projection 20 and the circular recess 18. At the same time, the chuck table 38 is rotated to thereby circularly remove the boundary between the annular projection 20 and the circular recess 18 by ablation using the laser beam applied from the focusing means 48. Preferably, as shown in FIG. 9, the chuck table 38 is composed of a suction holding member 38a and a mount member 38b having an annular groove 27 formed so as to correspond to the boundary between the annular projection 20 and the circular recess 18, wherein a laser beam absorbing member 29 is provided in the annular groove 27. Accordingly, it is possible to prevent the laser beam applied from the focusing means 48 from processing (damaging) the mount member 38b of the chuck table 38. Thus, the laser beam is applied to the whole of the circular boundary between the annular projection 20 and the circular recess 18, thereby forming a full-cut groove (kerf) 25 separating the device area 17 and the annular projection 20 of the wafer 11 from each other and also separating the first dicing tape T1 into a central portion attached to the device area 17 and a peripheral portion attached to the annular projection 20 (separating step).

Figure 10:
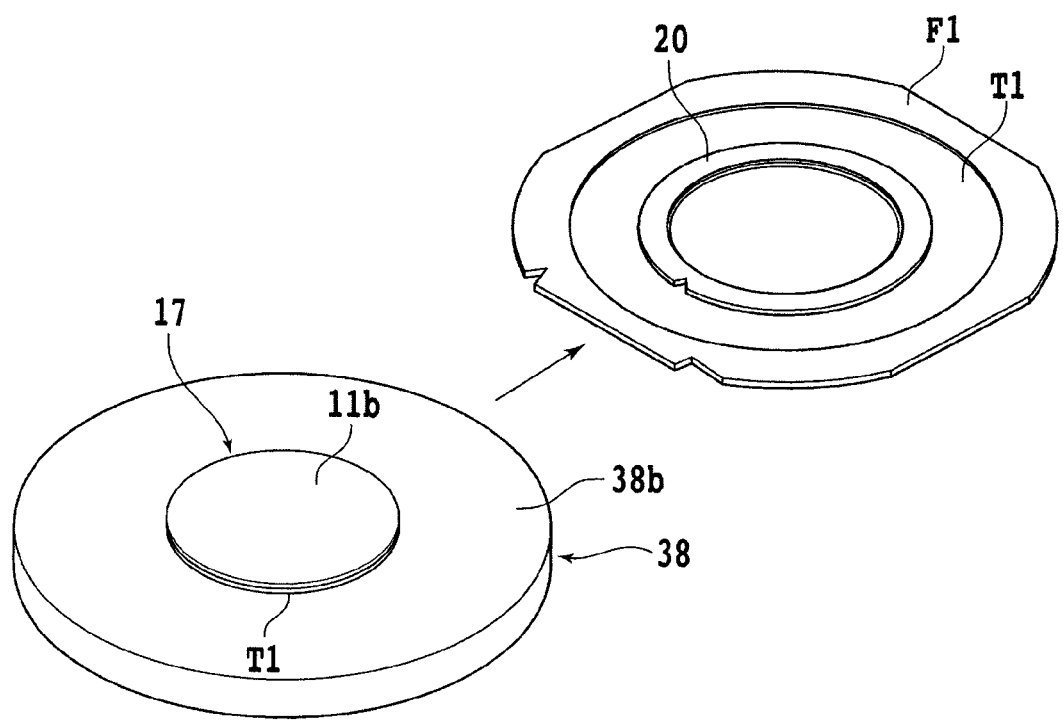
FIG. 10 is a perspective view showing a removing step.

After performing the separating step, a removing step is performed in such a manner that the annular projection 20 supported through the peripheral portion of the first dicing tape T1 to the first annular frame F1 is removed from the device area 17 of the wafer 11 as shown in FIG. 10. In the case that the protective film forming step mentioned above is performed, a protective film removing step of removing the protective film by supplying a cleaning water to the back side 11b of the wafer 11 is performed after performing the separating step. This protective film removing step will now be described with reference to FIG. 11.

Figure 11:
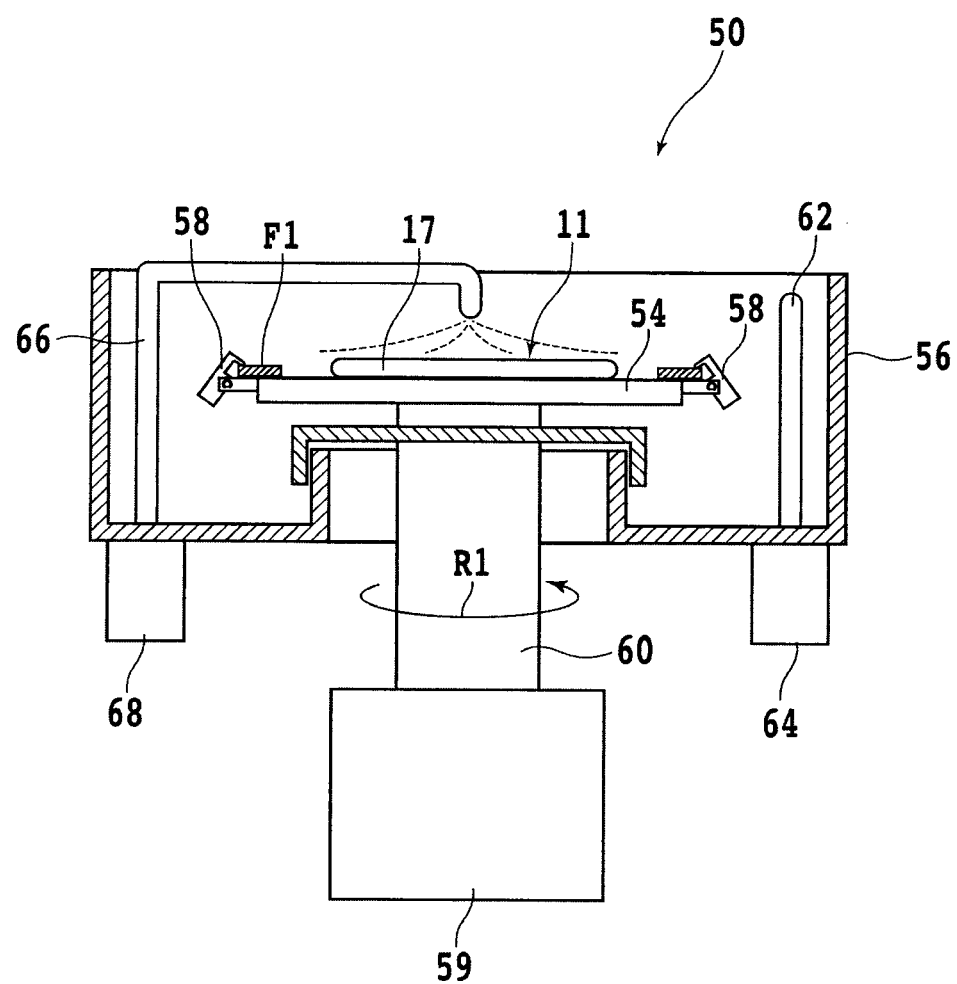
FIG. 11 is a sectional view showing a cleaning step.

As shown in FIG. 11, the wafer 11 supported through the first dicing tape T1 to the first annular frame F1 is held under suction on the spinner table 54 of the protective film forming unit 50 in the condition where the first dicing tape T1 attached to the front side 11a of the wafer 11 is in contact with the upper surface of the spinner table 54, i.e., the back side 11b of the wafer 11 is exposed, wherein the protective film is formed on the bottom surface of the circular recess 18 formed on the back side 11b of the wafer 11, i.e., the protective film is formed on the back side 11b of the wafer in the area corresponding to the device area 17. In this condition, the motor 68 is operated to rotate the cleaning water nozzle 66 from the standby position to the supply position shown in FIG. 11. Thereafter, a cleaning water 11 is supplied from the cleaning water nozzle 66 to the wafer 11 at its central portion. At the same time, the electric motor 59 is operated to rotate the spinner table 54 at about 1000 rpm in the direction shown by an arrow R1 in FIG. 11. Since the protective film is a water-soluble protective film, the protective film can be removed from the back side 11b of the wafer 11 by this cleaning step (protective film removing step).

After performing the separating step and the next protective film removing step as mentioned above, the removing step is performed to remove the annular projection 20 supported through the peripheral portion of the first dicing tape T1 to the first annular frame F1, from the device area 17 of the wafer 11 as shown in FIG. 10. Accordingly, the device area 17 attached to the central portion of the first dicing tape T1 is left on the chuck table 38.

Figure 12:
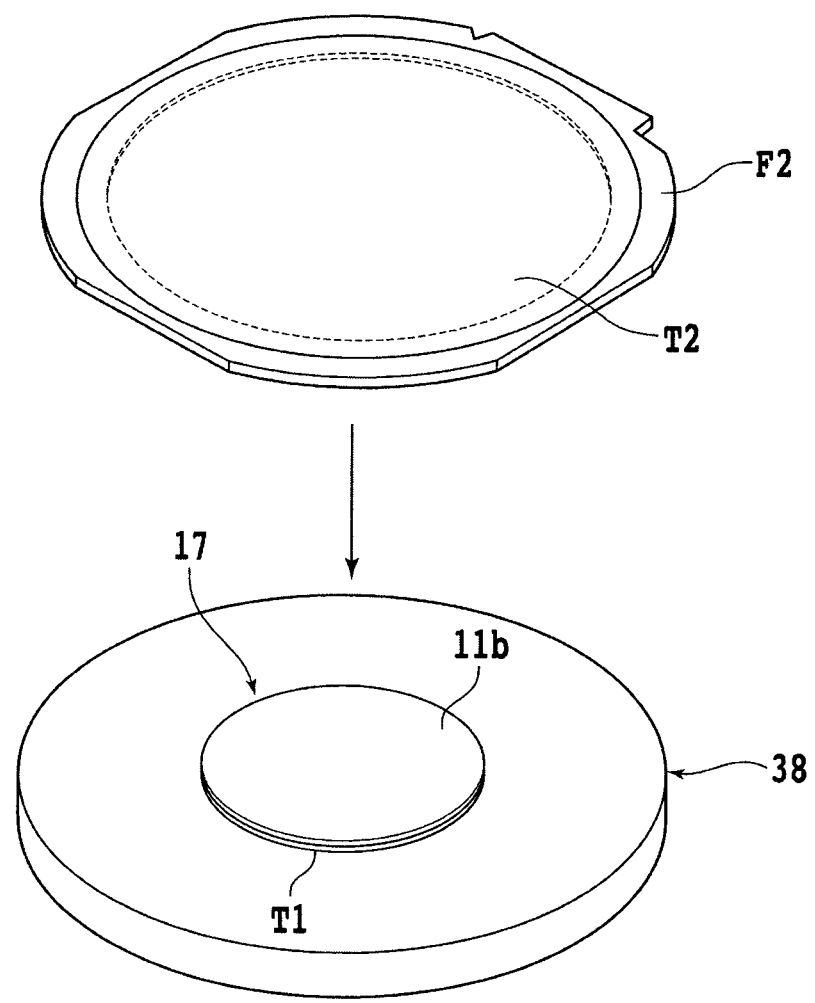
FIG. 12 is a perspective view showing a second tape attaching step.

After performing the removing step, a second tape attaching step is performed in the following manner as shown in FIG. 12. A second dicing tape T2 is attached to the back side 11b of the wafer 11 composed of only the device area 17 at this time, and the wafer 11 is then mounted through the second dicing tape T2 to a second annular frame F2 as shown in FIG. 12. By performing this second tape attaching step, the wafer 11 composed of only the device area 17 is supported through the second dicing tape T2 to the second annular frame F2 in the condition where the first dicing tape T1 remains attached to the front side 11a of the wafer 11.

Figure 13:
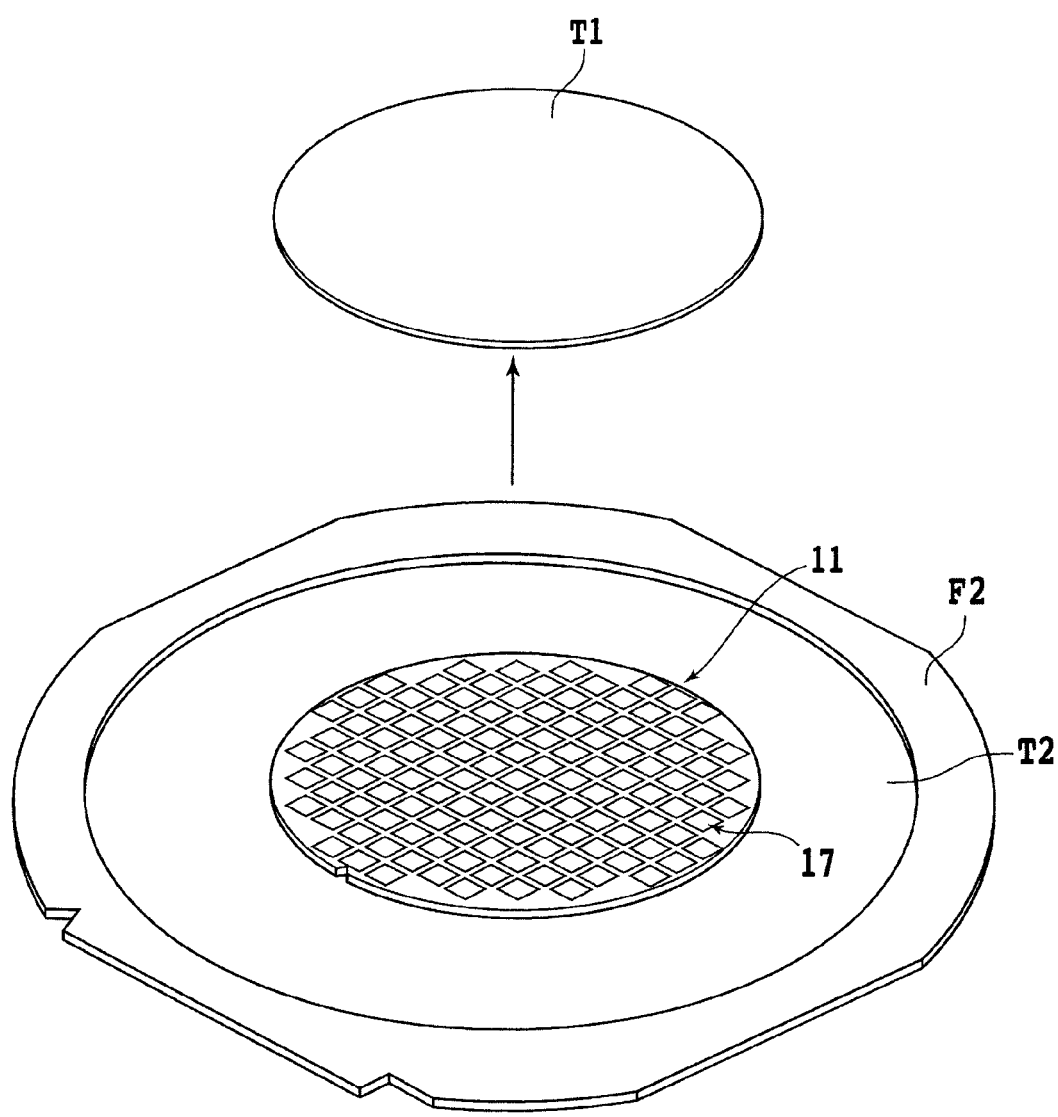
FIG. 13 is a perspective view showing a first tape removing step.

After performing the second tape attaching step as mentioned above, a first tape removing step is performed in such a manner that the first dicing tape T1 is removed from the front side 11a of the wafer 11 as shown in FIG. 13. As a modification, this first tape removing step may be performed before performing the second tape attaching step. After performing the second tape attaching step and the first tape removing step as mentioned above, a dividing step of dividing the wafer 11 into the individual devices 15 is performed.

Figure 14:
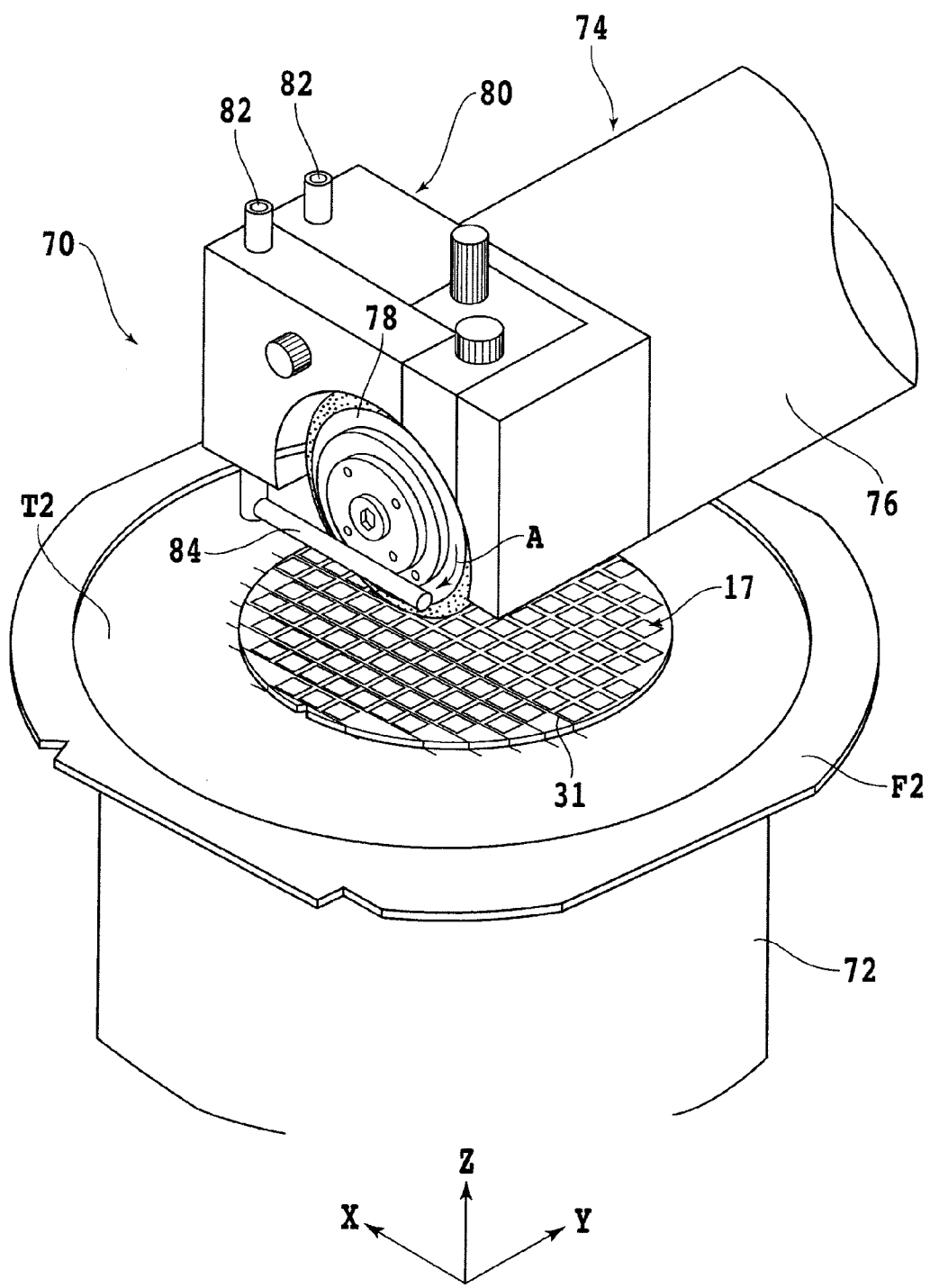
FIG. 14 is a perspective view showing a dividing step.

For example, the dividing step is performed by using a cutting apparatus 70 shown in FIG. 14. In FIG. 14, an essential part of the cutting apparatus 70 is shown. The cutting apparatus 70 includes a cutting unit 74 having a spindle housing 76, a spindle (not shown) provided in the spindle housing 76 so as to be rotationally driven by a motor (not shown), and a cutting blade 78 detachably mounted on the front end of the spindle.

The cutting blade 78 is covered with a wheel cover 80. The wheel cover 80 is provided with a pair of pipes 82 connected to a cutting water source (not shown). The wheel cover 80 is further provided with a pair of cutting water nozzles 84 (one of which being shown) connected to the pair of pipes 82. The pair of cutting water nozzles 84 are so arranged as to interpose the cutting blade 78. Accordingly, a cutting water supplied from the cutting water source to the pipes 82 is discharged from the cutting water nozzles 84 to the cutting blade 78 in cutting the wafer 11 (the device area 17). That is, the device area 17 is cut by the cutting blade 78 as discharging the cutting water from the cutting water nozzles 84 to the cutting blade 78. At the same time, the cutting blade 78 is rotated at a high speed (e.g., 30000 rpm) in the direction shown by an arrow A in FIG. 14, and a chuck table 72 included in the cutting apparatus 70 is fed in the X direction shown in FIG. 14, wherein the device area 17 supported through the second dicing tape T2 to the second annular frame F2 is held on the chuck table 72 in the condition where the front side of the device area 17 (the front side 11a of the wafer 11) is oriented upward. Accordingly, the device area 17 is cut along each street 13 to thereby form a cut groove (kerf) 31 along each street 13 as shown in FIG. 14.

More specifically, the device area 17 is first cut along all of the streets 13 extending in a first direction as sequentially indexing the cutting unit 74 in the Y direction shown in FIG. 14 by the pitch of the streets 13. Thereafter, the chuck table 72 is rotated 90° to similarly perform such a cutting operation along all of the remaining streets 13 extending in a second direction perpendicular to the first direction. Thusly, the device area 17 of the wafer 11 is divided into the individual devices 15.

This dividing step is not limited to such a cutting step (dicing step) using the cutting apparatus 70, but may be a laser processing step. For example, ablation using a laser beam may be adopted to form a laser processed groove (kerf) on the wafer 11 along each street 13. As a modification, a laser beam may be applied to the wafer 11 to form a modified layer inside the wafer 11 along each street 13. Thereafter, an external force may be applied to the wafer 11 to thereby break the wafer 11 along each street 13 where the modified layer is formed. Thusly, the device area 17 of the wafer 11 may be divided into the individual devices 15 by using a laser beam. In this case, the laser beam may be applied from the front side of the wafer or from the back side of the wafer.

Further, while the protective tape 23 is attached to the front side 11a of the wafer 11 before grinding the back side 11b of the wafer 11 to form the circular recess 18 and the annular projection 20 in the above preferred embodiment, the protective tape 23 may be omitted in the present invention. That is, the first tape attaching step may be performed before grinding the back side 11b of the wafer 11, wherein the first dicing tape T1 as an adhesive tape is attached to the front side 11a of the wafer 11, and the wafer 11 is mounted through the first dicing tape T1 to the first annular frame F1.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A processing method for a wafer having a device area where a plurality of devices are formed and a peripheral marginal area surrounding said device area on a front side of said wafer, wherein a circular recess corresponding to said device area is formed on a back side of said wafer by grinding said wafer to a predetermined thickness, and an annular projection corresponding to said peripheral marginal area is resultantly formed around said circular recess, said processing method comprising:

a first tape attaching step of attaching a first tape to the front side of said wafer and mounting said wafer through said first tape to a first annular frame;

a separating step of holding said wafer through said first tape on a chuck table after performing said first tape attaching step, the chuck table having an annular groove at a corresponding area of a boundary between said annular projection and said device area, and then applying a laser beam to cut through said wafer and said first tape in their entirety along said boundary between said annular projection and said device area to cut said wafer and said first tape along said boundary, thereby separating said device area from said annular projection; and a removing step of removing said annular projection together with the first annular frame from said device area of said wafer in the condition where said annular projection is supported through said first tape to said first annular frame after performing said separating step.

2. The processing method according to claim 1, further comprising:

a second tape attaching step of attaching a second tape to the back side of said wafer composed of only said device area after performing said removing step and mounting said wafer through said second tape to a second annular frame;

a first tape removing step of removing said first tape from the front side of said wafer before or after performing said second tape attaching step; and a dividing step of dividing said wafer into a plurality of chips corresponding to said plurality of devices after performing said second tape attaching step and said first tape removing step.

3. The processing method according to claim 1, further comprising:

a protective film forming step of forming a water-soluble protective film on the back side of said wafer before performing said separating step; and a protective film removing step of supplying a cleaning water to the back side of said wafer after performing said protective film forming step and said separating step to remove the protective film.

* * * * *